United States Patent
Yamamoto et al.

(10) Patent No.: US 7,495,035 B2
(45) Date of Patent: Feb. 24, 2009

(54) PHOTO-CURABLE RESIN COMPOSITION AND SEALING AGENT FOR FLAT PANEL DISPLAY USING THE SAME

(75) Inventors: Yugo Yamamoto, Sodegaura (JP); Yasushi Mizuta, Sodegaura (JP); Yuichi Ito, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 398 days.

(21) Appl. No.: 10/567,864

(22) PCT Filed: Aug. 10, 2004

(86) PCT No.: PCT/JP2004/011465
§ 371 (c)(1),
(2), (4) Date: Feb. 10, 2006

(87) PCT Pub. No.: WO2005/014686
PCT Pub. Date: Feb. 17, 2005

(65) Prior Publication Data
US 2006/0241208 A1   Oct. 26, 2006

(30) Foreign Application Priority Data
Aug. 12, 2003 (JP) ............................. 2003-207236
Oct. 6, 2003 (JP) ............................. 2003-346516

(51) Int. Cl.
*C08F 2/46* (2006.01)
(52) U.S. Cl. ............. 522/181; 522/168; 522/170; 522/172; 522/100; 522/71; 522/77; 522/79; 522/83; 427/487; 427/490; 427/508; 427/516; 427/207.1; 524/107; 524/117; 524/118; 428/1.3; 428/1.5; 428/1.53; 428/345; 428/355 R; 428/355 EP; 156/272.2; 156/275.5; 156/325; 156/326; 156/327; 156/329; 156/331.1
(58) Field of Classification Search ............... 522/168, 522/31, 107, 170, 172, 181, 100, 71, 77, 522/79, 83; 524/107, 117, 118; 523/160; 428/418, 1.3, 1.5, 1.53, 345, 355 R, 355 EP; 156/272.2, 275.5, 325, 326, 327, 329, 331, 156/1; 427/487, 508, 490, 516, 207.1
See application file for complete search history.

(56) References Cited

U.S. PATENT DOCUMENTS

| | | | | | |
|---|---|---|---|---|---|
| 4,394,403 | A | * | 7/1983 | Smith | 427/500 |
| 4,876,322 | A | * | 10/1989 | Budde et al. | 526/242 |
| 5,721,020 | A | * | 2/1998 | Takami et al. | 427/508 |
| 6,166,101 | A | * | 12/2000 | Takami | 522/168 |
| 6,322,892 | B1 | * | 11/2001 | Takami | 428/418 |
| 6,365,644 | B1 | * | 4/2002 | Yamamura et al. | 522/168 |
| 6,586,496 | B1 | | 7/2003 | Takamatsu et al. | |
| 6,696,506 | B1 | | 2/2004 | Fukui | |
| 2001/0018477 | A1 | | 8/2001 | Kumakura | |

FOREIGN PATENT DOCUMENTS

| | | |
|---|---|---|
| CN | 1320146 A | 10/2000 |
| JP | 09-241603 A | 9/1997 |
| JP | 2000-72853 A | 3/2000 |
| JP | 2001-89743 A | 4/2001 |
| JP | 2001-139933 A | 5/2001 |
| JP | 2001-207120 A | 7/2001 |
| JP | 2001-207150 A | 7/2001 |

* cited by examiner

*Primary Examiner*—James Seidleck
*Assistant Examiner*—Frances Tischler
(74) *Attorney, Agent, or Firm*—Buchanan Ingersoll & Rooney PC

(57) ABSTRACT

It is an object of the present invention to provide a photo-curable resin composition which provides a sealing agent for a flat panel display with good moisture permeation resistance and excellent adhesion. The present inventors have conducted extensive studies to solve the above-described problems, and as a result, they have found a photo-curable resin composition which comprises a cationic photopolymerization initiator (A), a cationically polymerizable compound (B), a cyclic polyether compound (C) and another organic compound (D), wherein the amount of (B) is 1.0 to 99.9% by mass and the amount of (C) is 0.0 to 10.0% by mass, both based on the sum of (B), (C) and (D), and the sum (F) of the fluorine atoms in a fluorine-containing organic compound is 0.0 to 40.0% by mass, based on the sum of (B), (C) and (D), and wherein at least 1/1000 mass ratio of the (B) component is a compound containing an oxetanyl group, and both of the contents of (C) and (F) are not 0.0% by mass at the same time.

9 Claims, No Drawings

PHOTO-CURABLE RESIN COMPOSITION AND SEALING AGENT FOR FLAT PANEL DISPLAY USING THE SAME

TECHNICAL FIELD

The present invention relates to a photo-curable resin composition which exhibits excellent moisture permeation resistance and adhesion, and good productivity, and a sealing agent for a flat panel display using the photo-curable resin.

BACKGROUND ART

In recent years, flat panel displays using various display elements have been developed and produced in the electronic and electric industries. Most of the displays are those given by sealing a display element in a glass or plastic cell. Representative examples of such displays include a liquid crystal (LC) display, an electroluminescent (EL) display and the like. Among them, the EL display is excellent in high luminance, high efficiency, fast response and the like and is attracting attention as a flat panel display of the next generation. Examples of the EL elements include inorganic EL elements and organic EL elements. The inorganic EL element has been put into practical use for a backlight of watch, and the like, but still has some technical problems in full-colorizing. The organic EL element is superior to the inorganic EL element in the high luminance, high efficiency, fast response and multi-color development but has low heat resistance, and its heat-resistant temperature is said to be in the range of about 80 to 120° C. Therefore, in the sealing of the organic EL display, there is a problem that a thermosetting epoxy resin cannot be completely cured by heating.

To solve such problems as mentioned above, an attempt to develop a photo-curable sealing agent capable of undergoing fast curing at low temperatures has been made. The photo-curable sealing agents are roughly classified as photo-radically curable sealing agents or cationically photo-curable sealing agents. The photo-radically curable sealing agent has an advantage that various acrylate monomers or oligomers are employable, but has high volume shrinkage and low adhesive force upon curing. Thus, in order to decrease the volume shrinkage, the number of the functional groups per unit weight of the sealing agent must be small, and thus various physical properties become limited. On the other hand, the cationically photo-curable sealing agent has lower curing shrinkage and higher adhesive force than those of the photo-radically curable sealing agent since it uses a ring-opening polymerization, nevertheless, further improvement has been required with respect to practical use. In the preparation of the flat panel display, in order to enhance the production yield, a process wherein several panels are formed and adhered onto a large glass substrate, and then the glass substrate is separated therefrom is provided. In this process, high stress is applied on the glass substrate, and hence there is a problem that in the case where the sealing agent has insufficient adhesive strength, delamination may occur. Further, sealing the organic EL element requires high moisture permeation resistance, as well as surface adhesion to the various members used in the organic EL element for preventing water from penetrating into the panel from the adhered surface.

Patent Document 1: JP-A No. 2001-139933
Patent Document 2: JP-A No. 2000-72853
Patent Document 3: JP-A No. 09-241603

DISCLOSURE OF THE INVENTION

Problems to be Solved by the Invention

It is an object of the present invention to provide a photo-curable resin composition which provides a sealing agent for a flat panel display with good moisture permeation resistance and excellent adhesion, and a sealing agent for a flat panel display using the same.

Means for Solving the Problems

The present inventors have conducted extensive studies to solve the above-described problems. As a result, we have found a photo-curable resin composition which comprises a cationic photopolymerization initiator (A), a cationically polymerizable compound (B), a cyclic polyether compound (C) and another organic compound (D), wherein the amount of (B) and the amount of (C) are 1.0 to 99.9% by mass and 0.0 to 10.0% by mass, respectively, both based on the sum of (B), (C) and (D), and the sum (F) of the fluorine atoms in a fluorine-containing organic compound is 0.0 to 40.0% by mass, based on the sum of (B), (C) and (D), and wherein at least 1/1000 mass ratio of the (B) component is a compound containing an oxetanyl group, and both of the contents of (C) and (F) are not 0.0% by mass at the same time. Further, the photo-curable resin composition comprises an inorganic filler in an amount of 0 to 250 parts by mass, based on 100 parts by mass of the sum of the components (A), (B), (C) and (D). The (B) and/or (D) components may contain a fluorine-containing coupling agent. Preferred is a photo-curable resin composition, wherein the sum (F) of the fluorine atoms in the fluorine-containing organic compounds is 0.1 to 40.0% by mass, based on the sum of (B), (C) and (D). Further, a sealing agent for a flat panel display contains the above-described photo-curable resin composition, and a flat panel display is obtained by using the sealing agent.

Effects of the Invention

According to the invention, a photo-curable resin composition which provides a sealing agent for a flat panel display with good moisture permeation resistance and excellent adhesion, and a sealing agent for a flat panel display using the same can be obtained.

Best Mode for Carrying out the Invention

Hereinafter, the present invention is described in more detail.

[Cationic Photopolymerization Initiator (A)]

As the photo-cationic initiator (A) in the invention, any compound which can initiate cationic polymerization by the action of light can be used without particular limitation. A preferred example of the photo-cationic initiator is an onium salt having a structure represented by the following formula (1). This onium salt is a compound which undergoes a photo-reaction to release a Lewis acid.

$$[R5aR6bR7cR8dW]m+[MXn+m]m-  \quad \text{Formula (1)}$$

wherein the cation is an onium ion; W is S, Se, Te, P, As, Sb, Bi, O, I, Br, Cl or N≡N; R5, R6, R7 and R8 are organic groups which are the same as or different from each other; a, b, c and d are each an integer of 0 to 3; and (a+b+c+d) equals to ((a valence of W)+m). M is a metal or a metalloid which constitutes a central atom of the halide complex [MXn+m], such as B, P, As, Sb, Fe, Sn, Bi, Al, Ca, In, Ti, Zn, Sc, V, Cr, Mn or Co. X is, for example, a halogen atom, such as F, Cl or Br, m is a net electric charge of the halide complex ion, and n is a valence of M.

Specific examples of the onium ion in the general formula (1) include diphenyliodonium, 4-methoxydiphenyliodonium, bis(4-methylphenyl)iodonium, bis(4-tert-butylphenyl)iodonium, bis(dodecylphenyl)iodonium, tolylcumyliodonium, triphenylsulfonium, diphenyl-4-thiophenoxyphenylsulfonium, bis[4-(diphenylsulfonio)-phenyl]sulfide, bis[4-(di(4-(2-hydroxyethyl)phenyl)sulfonio)-phenyl]sulfide, η5-2,4-(cyclopentadienyl)[1,2,3,4,5,6-η-(methylethyl)benzene]-iron(1+) and the like.

Specific examples of the anion in the general formula (1) include tetrafuloroborate, hexafluorophosphate, hexafluoroantimonate, hexafluoroarsenate, hexachloroantimonate and the like. In the general formula (1), the halide complex [MXn+m] as the anion may be replaced with a perchlorate ion, a trifluoromethanesulfonate ion, a toluenesulfonate ion, a trinitrotoluenesulfonate ion or the like. In the general formula (1), the halide complex [MXn+m] as the anion may be further replaced with an aromatic anion. Specific examples of the aromatic anions include tetra(fluorophenyl)borate, tetra(difluorophenyl)borate, tetra(trifluorophenyl)borate, tetra(tetrafluorophenyl)borate, tetra(pentafluorophenyl)borate, tetra(perfluorophenyl)borate, tetra(trifluoromethylphenyl)borate, tetra(di(trifluoromethyl)phenyl)borate and the like. These photo-cationic initiators can be used alone or in combination of two or more species thereof.

The content of these photo-cationic initiators in the resin composition of the invention is usually 0.1 to 10% by weight, and preferably 0.3 to 3% by weight. By the use of the photo-cationic initiator in an amount of 0.1% by weight or more, the curing state of the resin composition is preferably improved, and from the viewpoint of preventing elution of the photo-cationic initiator after curing, the amount thereof is preferably 10% by weight or less.

[Cationically Polymerizable Compound (B)]

The cationically polymerizable compound (B) in the invention is a compound having at least one cationically polymerizable functional group in one molecule, and specifically a material selected from a compound containing an epoxy group, a compound containing an oxetanyl group, an oxolane compound, a cyclic acetal compound, a cyclic lactone compound, a thiirane compound, a thietane compound, a spiroorthoester compound, a vinyl ether compound, an ethylenically unsaturated compound, a cyclic ether compound, a cyclic thioether compound and a vinyl compound. Preferably used is a material containing an epoxy group or an oxetanyl group as a functional group.

Specific examples of the cationically polymerizable compound include the followings. As the compound containing an epoxy group, mention may be made of a monofunctional epoxy compound such as phenyl glycidyl ether, 2-ethylhexyl glycidyl ether, ethyldiethylene glycol glycidyl ether, dicyclopentadiene glycidyl ether and 2-hydroxyethyl glycidyl ether; a bifunctional epoxy compound such as hydroquinone diglycidyl ether, resorcinol diglycidyl ether, ethylene glycol diglycidyl ether, polyethylene glycol diglycidyl ether, 1,4-butanediol diglycidyl ether, 1,6-hexanediol diglycidyl ether, cyclohexanediol diglycidyl ether, cyclohexanedimethanol diglycidyl ether, dicyclopentadienediol diglycidyl ether, 1,6-naphthalenediol diglycidyl ether, bisphenol A diglycidyl ether, bisphenol F diglycidyl ether, hydrogenated bisphenol A diglycidyl ether and hydrogenated bisphenol F diglycidyl ether; and a multifunctional epoxy compound such as trimethylolpropane triglycidyl ether, pentaerythritol tetraglycidyl ether, a phenol novolak-type epoxy compound and a cresol novolak-type epoxy compound.

As the compound containing an oxetanyl group, mention may be made by a monofunctional oxetane compound such as 3-ethyl-3-hydroxymethyloxetane, (3-ethyl-3-oxetanylmethoxy)methylbenzene, [1-(3-ethyl-3-oxetanylmethoxy)ethyl]phenyl ether, 2-ethylhexyl(3-ethyl-3-oxetanylmethyl) ether, dicyclopentadiene(3-ethyl-3-oxetanylmethyl)ether and 2-hydroxyethyl(3-ethyl-3-oxetanylmethyl)ether; a bifunctional oxetane compound such as bis(3-ethyl-3-methyloxetane)ether, 1,4-bis[(3-ethyl-3-oxetanylmethoxy)methyl]benzene, 1,3-bis[(3-ethyl-3-oxetanylmethoxy)methyl]benzene, dicyclopentenylbis(3-ethyl-3-oxetanylmethyl)ether, triethylene glycol bis(3-ethyl-3-oxetanylmethyl)ether, bisphenol A bis(3-ethyl-3-oxetanylmethyl)ether and bisphenol F bis(3-ethyl-3-oxetanylmethyl)ether; and a multifunctional oxetane compound such as a (3-ethyl-3-oxetanylmethyl)ether compound of a phenol novolak-type resin and a (3-ethyl-3-oxetanylmethyl)ether compound of a cresol novolak-type resin.

As the alicyclic epoxy compound, mention may be made of the compounds which are each represented by the following formula (2), formula (3), formula (4) and formula (5).

Formula (2):

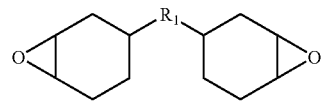

In the formula (2), $R_1$ is an oxygen atom; a sulfur atom; a linear or branched alkylene group containing 1 to 20 carbon atoms such as a methylene group, an ethylene group, a propylene group or a butylene group; a linear or branched poly(alkyleneoxy) group containing 1 to 120 carbon atoms such as a poly(ethyleneoxy) group or a poly(propyleneoxy) group; a linear or branched unsaturated hydrocarbon group such as a propenylene group, a methylpropenylene group or a butenylene group; a carbonyl group; an alkylene group having a carbonyl group; or an alkylene group having a carbamoyl group in the molecular chain.

Formula (3):

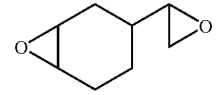

Formula (4):

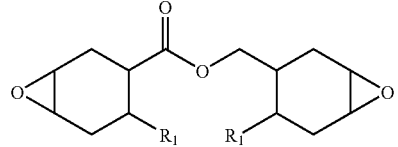

In the formula (4), $R_1$ is a hydrogen atom; a fluorine atom; an alkyl group containing 1 to 6 carbon atoms such as a methyl group, an ethyl group, a propyl group, a butyl group, a pentyl group or a hexyl group; a fluoroalkyl group containing 1 to 6 carbon atoms such as a trifluoromethyl group, a perfluoromethyl group, a perfluoroethyl group or a perfluoropropyl group; an aryl group containing 6 to 18 carbon atoms such as a phenyl group or a naphthyl group; a furyl group; or a thienyl group. $R_1$'s may be the same as or different from each other.

Formula (5):

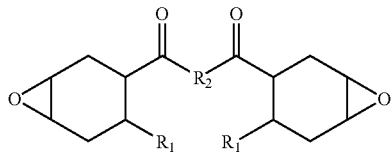

In the formula (5), $R_1$ is a hydrogen atom; a fluorine atom; an alkyl group containing 1 to 6 carbon atoms such as a methyl group, an ethyl group, a propyl group, a butyl group, a pentyl group or a hexyl group; a fluoroalkyl group containing 1 to 6 carbon atoms such as a trifluoromethyl group, a perfluoromethyl group, a perfluoroethyl group or a perfluoropropyl group; an aryl group containing 6 to 18 carbon atoms such as a phenyl group or a naphthyl group; a furyl group; or a thienyl group. $R_1$'s may be the same as or different from each other. $R_2$ is an oxygen atom; a sulfur atom; a linear or branched alkylene group containing 1 to 20 carbon atoms such as a methylene group, an ethylene group, a propylene group or a butylene group; a linear or branched poly(alkyleneoxy) group containing 1 to 120 carbon atoms such as a poly(ethyleneoxy) group or a poly(propyleneoxy) group; a linear or branched unsaturated hydrocarbon group such as a propenylene group, a methylpropenylene group or a butenylene group; a carbonyl group; an alkylene group having a carbonyl group; or an alkylene group having a carbamoyl group in the molecular chain. Further, mention may be made of compounds in which the hydrogen atoms of the carbon-hydrogen bonds in the compounds of the formulas (2) to (5) can be partially or completely substituted with a fluorine atom. More specifically, examples thereof include a compound (bisphenol AF diglycidyl ether) in which a total of six hydrogen atoms of the methyl group in the bisphenol A glycidyl ether are substituted with fluorine atoms, and a resultant product of a compound in which a total of six hydrogen atoms of the methyl group in the bisphenol A are substituted with fluorine atoms, with an epoxy compound.

Further, the component (B) may be a coupling agent containing a cationically polymerizable functional group such as a glycidyl group, which will be described later. Examples thereof include γ-glycidoxypropyltrimethoxysilane and the like.

Particularly, when at least 1/1000 mass ratio of the cationically polymerizable (B) component is a compound containing an oxetanyl group, the adhesive strength can be improved without lowering the curability. The content of the cationically polymerizable compound (B) is 1.0 to 99.9% by mass, preferably 1 to 90% by mass, and more preferably 1 to 70% by mass, based on the sum of (B), and the below described (C) and (D). The content of the cationically polymerizable compound (B) within the above described ranges leads to a composition which is excellent in heat resistance after curing and adhesive strength.

[Cyclic Polyether Compound (C)]

As the cyclic polyether compound (C) according to the invention, mention may be made of the compound represented by the following formula (6).

Formula (6):

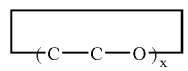

In the general formula (6), x is an integer of 2 or more. Specific examples of the cyclic polyether compound include a cyclic polyoxyethylene compound such as 12-crown-4-ether, 15-crown-5-ether, 18-crown-6-ether and 21-crown-7-ether.

In addition, as a compound having a similar structure, mention may be made of compounds containing a cyclic polyoxyethylene compound in a portion of its structure, such as dibenzo-18-crown-6-ether, cyclohexano-18-crown-6-ether, dicyclohexyl-18-crown-6-ether, 2-hydroxymethyl-18-crown-6-ether, 2-aminomethyl-18-crown-6-ether, cyclohexano-15-crown-5-ether, 2-hydroxymethyl-15-crown-5-ether, 2-aminomethyl-15-crown-5-ether, 2,3-bis-(2-chloro-phenyl)-1,4,7,10,13-pentaoxa-cyclopentadecane, cyclohexano-12-crown-4-ether, 2-hydroxymethyl-12-crown-4-ether and cryptand. Further, such compounds in which the hydrogen atoms of the carbon-hydrogen bonds are partially or completely substituted with fluorine atoms can also be used.

The content of the cyclic polyether compound (C) is usually 0 to 10% by weight, preferably 0.3 to 7% by weight, and more preferably 0.5 to 5% by weight, based on the sum of (B), (C) and the below described (D). The content of the cyclic polyether compound (C) within the above described ranges leads to stress-strain relaxation during curing by control of the curability of the photo-curable resin composition, thereby the adhesive strength being improved.

[Other Organic Compound (D)]

In the resin composition of the invention, other organic compound (D) such as other resin components, a coupling agent, a curing enhancer, a filler, a modifier and a stabilizer can be contained within the range that does not adversely affect the effects of the invention.

<Other Resin Components>

Examples of other resin components include polyamide, polyamidoimide, polyurethane, polybutadiene, polychloroprene, polyether, polyester, a styrene/butadiene/styrene block copolymer, a petroleum resin, a xylene resin, a ketone resin, a cellulose resin, a fluorine-based oligomer, a silicon-based oligomer and a polysulfide-based oligomer. These resins may be used alone or in combination of two or more species thereof.

<Coupling Agent>

A coupling agent can be added in order to improve adhesion at the interface with a substrate. As the coupling agent, the compound represented by the following formula (7) or (8):

$(R_2O)_3$—Si—$R_3R_4$            Formula (7)

$(R_2O)_3$—Ti—$R_3R_4$            Formula (8)

In the formula (7) or (8), $R_2$ is an alkyl group such as a methyl group, an ethyl group or a propyl group. $R_3$ is a linear or branched alkylene group containing 1 to 20 carbon atoms such as a methylene group, an ethylene group, a propylene group or a butylene group; a linear or branched poly(alkyleneoxy) group containing 1 to 120 carbon atoms such as a poly(ethyleneoxy) group or a poly(propyleneoxy) group; a linear or branched unsaturated hydrocarbon group such as a propenylene group, a methylpropenylene group or a butenylene group; a carbonyl group; an alkylene group having a carbonyl group; an alkylene group having a carbamoyl group in the molecular chain; or a phenyl group. Further, $R_4$ is an alkyl group such as a methyl group, an ethyl group or a propyl group; a glycidyl ether group; primary amine; a thiol group; a vinyl group; or an isocyanate group. Materials in which the hydrogen atoms of the carbon-hydrogen bonds in these coupling agents are partially or completely substituted with fluorine atoms can also be used. Preferably, materials in which the hydrogen atom in a methylene group or a methyl group is partially or completely substituted with a fluorine atom are used.

<Curing Enhancer>

A photosensitizer or a photo-radical initiator may be added for the purpose of improving photoreactivity. Specifically, examples thereof include benzophenone, 2,2-diethoxyacetophenone, benzyl, benzoyl isopropyl ether, benzyl dimethyl ketal, 1-hydroxycyclohexyl phenyl ketone, thioxanthone and the like. The amount thereof to be used in the photo-curable resin composition is 0.1 to 5 mass %. The amount of 0.1% by mass or more leads to subjecting the composition to curing by irradiation of light and the amount of 5% by mass or less leads to suppression of hygroscopicity of the cured material. In addition, for the same purpose, a radically polymerizable compound, a representative of which is an acrylic monomer, may be added.

<Filler>

Examples of the filler include styrene polymer particles, methacrylate polymer particles, ethylene polymer particles, propylene polymer particles and the like. These fillers may be used alone or in combination of two or more species thereof.

<Modifier>

Examples of the modifier include a polymerization initiator assistant, an anti-aging agent, a leveling agent, a wettability improver, a surface active agent, a plasticizer and the like. These modifiers may be used alone or in combination of two or more species thereof.

<Stabilizer>

Examples of the stabilizer include an ultraviolet absorber, an antiseptic agent, an antibacterial agent and the like. These stabilizers may be used alone or in combination of two or more species thereof. Further, compounds in which the hydrogen atoms of the carbon-hydrogen bonds in these components are partially or completely substituted with fluorine atoms can also be used.

In the resin composition of the invention, when a fluorine-containing organic compound is contained in the components (B), (C) and (D), the hydrophobicity of the component having moisture permeation after curing is improved, whereby the moisture permeation resistance can be improved. By using the fluorine-containing organic compound in the components (B) and/or (D), the adhesive strength can be improved. In the view point of the adhesive strength, it is preferable that the sum (F) of the fluorine contents is 0 to 40% by mass in terms of fluorine atom, based on the total mass of the components (B), (C) and (D).

The resin composition of the invention is characterized in that it has excellent moisture permeation resistance, as well as high adhesive strength. Both of the contents of the component (C) and (F) should not be 0.0% by mass at the same time. When the fluorine-containing organic compound is contained in the components (A), (B), (C) and (D), the sum (F) of fluorine contents is preferably 0.0 to 40.0% by mass in terms of fluorine atom, based on the total mass of (A), (B), (C) and (D).

[Fine Particle Inorganic Filler]

The resin composition of the invention preferably contains a fine particle inorganic filler. The fine particle inorganic filler is an inorganic filler having a primary particle average diameter of 0.005 to 10 μm. Specific examples thereof include silica, talc, alumina, mica, calcium carbonate and the like. As the fine particle inorganic filler, any of surface-treated fillers and surface-untreated fillers is employable. Examples of the surface-treated fine particle inorganic fillers include methoxylated, trimethylsilylated or octylsilylated fine particle inorganic fillers, and fine particle inorganic fillers having been surface-treated with silicone oil. These components can be used alone or in combination of two or more species thereof.

The fine particle inorganic filler is used in an amount of 0 to 250 parts by mass, based on 100 parts by mass of the sum of the above described components (A), (B), (C) and (D) to impart effects such as moisture permeation resistance, adhesive strength and thixotropy.

[Preparation of Resin Composition]

The photo-curable resin composition according to the invention is prepared by uniformly mixing the components. The viscosity thereof may be adjusted by changing the blending ratio of the resin or by adding other component(s). When the viscosity is high, kneading may be carried out by a conventional method, for example, using a three roll mill.

[Sealing Method]

There is no limitation on the method to apply the sealing agent so long as the sealing agent can be uniformly applied. For example, a known method such as screen printing or application using a dispenser may be carried out. After application of the sealing agent to the display substrate, the substrate is bonded to another display substrate, and the sealing agent is irradiated with light and thereby cured. As the light source which can be used herein, any of light sources capable of curing the sealing agent within a given period of an operation time may be used. Usually, a light source capable of radiating a light of a wave length within the range of ultraviolet to visible light is employed. More specifically, a low pressure mercury lamp, a high pressure mercury lamp, a xenon lamp or a metal halide lamp is used. The dosage of the light irradiation can usually be suitably selected within the range in which no residue of uncured resin composition remains or no deterioration in the adhesion occurs in case the irradiation dosage is too low, while the dosage is in the range of usually 500 to 9000 mJ/cm$^2$. While there is no special upper limit in the irradiation dosage, a superfluous dosage is not preferable because of uneconomical energy consumption and the lowering of the productivity.

EXAMPLES

The present invention is further described with reference to the following examples, but it should be construed that the invention is in no way limited to those examples.

<Measuring Method>

The resin compositions and the cured products obtained were evaluated as follows.

(Viscosity)

The viscosities of the resin compositions were determined using an E-type viscometer (RC-500 manufactured by Toki Sangyo Co., Ltd.) at 25° C.

(Film Moisture Permeability)

The film (thickness: 100 μm) of a resin composition which had been photo-cured in accordance with JIS Z0208 was measured for the moisture permeability under conditions of 40° C. and 90% RH.

(Adhesive Strength)

A glass plate sandwiched the resin composition (thickness: 20 μm) in a combination of another glass plate and irradiated with light to bond the glass plates. Then, these two plates were separated from each other at a pulling rate of 2 mm/min to measure the adhesive strength.

(Adhesive Strength After Boiling)

A glass plate sandwiched the resin composition (thickness: 20 μm) in a combination of another glass plate and irradiated with light to bond the glass plates. A sample of the glass plates bonded was immersed in boiling water for 1 hour and then taken out for drying. These two plates were separated from each other at a pulling rate of 2 mm/min to measure the adhesive strength upon delamination of the two plates.

(Curability)

The resin composition was applied on a glass plate in a thickness of 100 μm and the coated layer was subjected to irradiation of light at a dosage of 3000 mJ using a metal halide lamp. The curing state of the coated film after the irradiation was assessed by finger touch.

○: Sufficiently cured
Δ: Partially cured
X: Not cured

<Starting Materials>

Fluorine-containing, cationically polymerizable compound: bisphenol AF diglycidyl ether Photo-cationic initiator: tolylcumyliodonium tetra(pentafluorophenyl)borate (trade name: RHODORSIL PHOTOINITIATOR 2074, manufactured by RHODIA)

Silane coupling agent: γ-glycidoxypropyltrimthoxysilane (trade name: SH6040, manufactured by Dow Corning Toray Silicone Co., Ltd.)

Fine particle inorganic filler: fine particle talc: surface-untreated, fine particle talc having a primary particle average diameter of 1 μm (trade name: SG-2000, manufactured by Nippon Talc Co., Ltd.)

Cationically polymerizable compound: bisphenol F diglycidyl ether (trade name: EXA-830LVP, manufactured by Dainippon Ink and Chemicals, Incorporated), 1,4-bis[(3-ethyl-3-oxetanylmethoxy)methyl]benzene (trade name: OXT-121, manufactured by Toagosei Co., Ltd.)

Example 1

(Preparation of Resin Composition)

According to the formulation shown in Table 1, a photo-cationic initiator, a cationically polymerizable compound, a coupling agent and a fine particle inorganic filler were kneaded with a three roll mill to obtain a liquid composition.

Examples 2 to 5 and Comparative Examples 1 to 3

According to the formulation shown in Table 1, a resin composition was prepared in the same manner as in Example 1, except that the components and amounts given in Table 1 were employed. Then, various evaluations were carried out on the resin compositions shown in Table 1. The results are shown in Table 1.

TABLE 1

|  | Content of F (mass %) | Example | | | | | | | | | Comparative Example | | |
| --- | --- | --- | --- | --- | --- | --- | --- | --- | --- | --- | --- | --- | --- |
|  |  | 1 | 2 | 3 | 4 | 5 | 6 | 7 | 8 | 9 | 1 | 2 | 3 |
| (A) Photo-cationic initiator | | | | | | | | | | | | | |
| Tolylcumyliodonium tetra(pentafluorophenyl)borate | 37.4 | 3 | 3 | 3 | 3 | 3 | 3 | 3 | 3 | 3 | 3 | 3 | 3 |
| (B) Cationically polymerizable compound | | | | | | | | | | | | | |
| Bisphenol F diglycidyl ether | 0 | 28 | 47.9 | 43 | 79 | 26 | 26 | 22 | 19 | 22 | 78 | 63 | 95 |
| 1,4-Bis[(3-ethyl-3-oxetanyl methoxy)methyl]benzene | 0 | 20 | 0.1 | 5 | 20 | 20 | 20 | 20 | 20 | 20 | 20 | 20 | — |
| Bisphenol AF diglycidyl ether | 26.9 | 50 | 50 | 50 | — | 50 | 50 | 50 | 50 | 50 | — | — | — |
| γ-glycidoxypropyltrimethoxysilane | 0 | 1 | 2 | 2 | — | 2 | 2 | 2 | 2 | 2 | 2 | 2 | — |
| (C) Cyclic polyether compound | | | | | | | | | | | | | |
| 18-crown-6-ether | 0 | — | — | — | 1 | 2 | 2 | 5 | 8 | 5 | — | 15 | 5 |
| (D) Other organic compound | | | | | | | | | | | | | |
| Fluorine-containing coupling agent | 52.8 | — | — | — | — | — | — | 1 | 1 | 1 | — | — | — |
| Inorganic fine particle | | | | | | | | | | | | | |
| Fine particle talc | | — | — | — | — | — | 30 | 30 | 30 | — | — | — | 30 |
| Fine particle spherical silica | | — | — | — | — | — | — | — | — | 150 | — | — | — |
| Total content of F in components (B), (C) and (D) (mass %) | | 13.5 | 13.5 | 13.5 | 0.0 | 13.5 | 13.5 | 14.0 | 14.0 | 14.0 | 0 | 0 | 0 |
| Viscosity (Pa·s) | | 12 | 15 | 16 | 7 | 10 | 55 | 55 | 52 | 63 | 6 | 6 | 50 |
| Moisture permeability (40° C., 90% RH) | | 18 | 17 | 17 | 21 | 19 | 15 | 14 | 15 | 12 | 34 | — | 51 |
| Adhesive strength (glass/glass) | | 21 | 19 | 20 | 25 | 25 | 26 | 26 | 27 | 24 | 21 | — | 8 |
| Adhesive strength after boiling (glass/glass) | | 18 | 17 | 18 | 16 | 22 | 15 | 26 | 27 | 24 | 10 | — | 4 |
| Curability | | ○ | ○ | ○ | ○ | ○ | ○ | ○ | ○ | ○ | ○ | x | □ |

INDUSTRIAL APPLICABILITY

The photo-curable resin composition according to the present invention can be employed in various fields including electronic materials, since it can afford good adhesive strength to various substrates to be applied.

The invention claimed is:

1. A photo-curable resin composition comprising a cationic photopolymerization initiator (A), a cationically polymerizable component (B) and a cyclic polyether compound (C) represented by Formula (6),
    wherein the component (B) comprises a compound containing an oxetanyl group at a mass ratio of at least 1/1000 of the component (B),
    the amount of the compound (C) is 0.3 to 10% by mass, based on the sum of the components (B) and the compound (C), and
    at least one of the components (B) and the compound (C) comprise a fluorine-containing organic compound in an amount of 0 to 40% by mass in terms of fluorine atom (F), based on the sum of the components (B) and the compound (C),

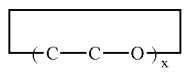
(6)

wherein x is an integer of 2 or more.

2. The photo-curable resin composition according to claim 1, further comprising an inorganic filler in an amount of 0 to 250 parts by mass, based on 100 parts by mass of the sum of the initiator (A), the component (B) and the compound (C).

3. A photo-curable resin composition comprising a cationic photopolymerization initiator (A), a cationically polymerizable component (B), a cyclic polyether compound (C) represented by formula (6) and another organic compound (D),
    wherein the component (B) comprises a compound containing an oxetanyl group at a mass ratio of at least 1/1000 of the component (B),
    the amounts of the components (B) and the compound (C) are 1 to 94% by mass and 0.3 to 10% by mass, respectively, both based on the sum of the components (B), and the compounds (C) and (D), and
    at least one of the components (B), and the compounds (C) and (D) comprise a fluorine-containing organic compound in an amount of 0 to 40% by mass in terms of fluorine atom (F), based on the sum of the component (B), and the compounds (C) and (D),

(6)

wherein x is an integer of 2 or more.

4. The photo-curable resin composition according to claim 3, further comprising an inorganic filler in an amount of 0 to 250 parts by mass, based on 100 parts by mass of the sum of the initiator (A), the component (B), and the compounds (C) and (D).

5. The photo-curable resin composition according to claim 1 or 2, wherein the component (B) contains a fluorine-containing coupling agent.

6. The photo-curable resin composition according to claim 3 or 4, wherein the component (B) and/or the compound (D) contain a fluorine-containing coupling agent.

7. A sealing agent for a flat panel display, comprising the photo-curable resin composition according to any one of claims 1, 2, 3, and 4.

8. A method for sealing a flat panel display comprising utilizing the sealing agent according to claim 7.

9. A flat panel display which is obtained by the method for sealing according to claim 8.

* * * * *